(12) United States Patent
Binder et al.

(10) Patent No.: US 9,853,421 B2
(45) Date of Patent: Dec. 26, 2017

(54) CARRIER MODULE WITH BRIDGING ELEMENT FOR A SEMICONDUCTOR ELEMENT

(71) Applicant: F.+S. Vermoegensverwaltungs GmbH, Pettenbach (AT)

(72) Inventors: Manuel Binder, Kallham (AT); Manuel Buchinger, Zell a. d. Pram (AT); Stephan Schartner, Sattledt (AT)

(73) Assignee: F.+S. Vermoegensverwaltungs GmbH, Pettenbach (AT)

( * ) Notice: Subject to any disclaimer, the term of this patent is extended or adjusted under 35 U.S.C. 154(b) by 247 days.

(21) Appl. No.: 14/577,581

(22) Filed: Dec. 19, 2014

(65) Prior Publication Data
US 2015/0181767 A1 Jun. 25, 2015

(30) Foreign Application Priority Data
Dec. 20, 2013 (AT) .............................. A 50849/2013

(51) Int. Cl.
*H05K 7/20* (2006.01)
*H01S 5/40* (2006.01)
*H01S 5/068* (2006.01)

(52) U.S. Cl.
CPC ......... *H01S 5/4025* (2013.01); *H05K 7/2089* (2013.01); *H01S 5/06825* (2013.01); *H01S 5/4031* (2013.01)

(58) Field of Classification Search
None
See application file for complete search history.

(56) References Cited

U.S. PATENT DOCUMENTS 5,610,799 A 3/1997 Kato
6,205,162 B1 3/2001 Shodo
(Continued)

FOREIGN PATENT DOCUMENTS

CN 101 420 102 4/2009
DE 101 13 943 10/2002
(Continued)

OTHER PUBLICATIONS

China Search Report conducted in China Appln. No. 201410858415.2 (dated Jan. 22, 2017) (w/ English language translation).

(Continued)

*Primary Examiner* — Courtney Smith
(74) *Attorney, Agent, or Firm* — Greenblum & Bernstein, P.L.C.

(57) ABSTRACT

Carrier module (1) for at least one semiconductor element (3) having a passively and/or actively cooled carrier (4) which has a positive carrier contact (5) and a negative carrier contact (6), with a device (2) for bridging the at least one semiconductor element (3) arranged on the carrier (4), comprising at least one first printed circuit board (7) with at least one bridging element (8), wherein at least one positive contact (9) which is electrically conductively connected to the positive carrier contact (5) and at least one negative contact (11) which is electrically conductively connected to the negative carrier contact (6) are provided on a first printed circuit board (7) and the bridging element (8) is electrically conductively connected to the positive contact (9) and to the negative contact (11) of the first printed circuit board (7), wherein the first printed circuit board (7) is thermally conductively and releasably connected to the carrier (4).

11 Claims, 3 Drawing Sheets

(56) References Cited

U.S. PATENT DOCUMENTS

Figure 1:
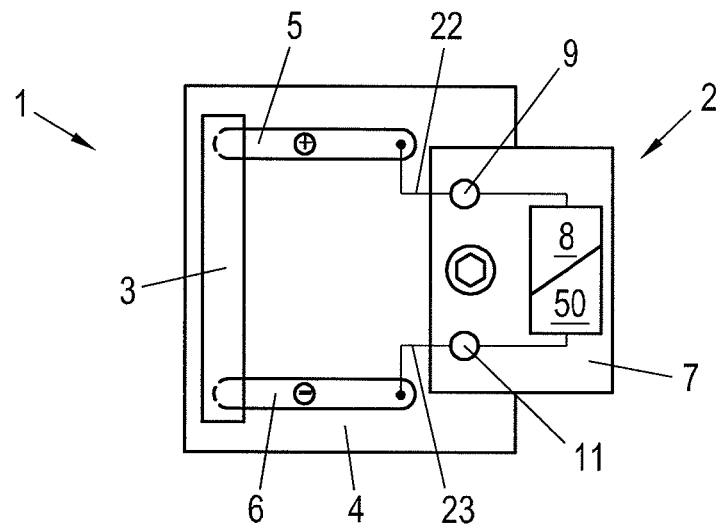

| | | | |
|---|---|---|---|
| 6,754,244 B2 | 6/2004 | Roellig et al. | |
| 7,952,981 B2 | 5/2011 | Suzuki | |
| 8,081,486 B2* | 12/2011 | Dorn | H01L 23/62 257/691 |
| 9,420,731 B2* | 8/2016 | Hosseini | |
| 2002/0064198 A1 | 5/2002 | Koizumi | |
| 2006/0039127 A1* | 2/2006 | West | H02M 7/003 361/803 |
| 2006/0194355 A1* | 8/2006 | Eberhard | H01S 5/0261 438/22 |
| 2009/0097208 A1* | 4/2009 | Matz | H01L 25/0657 361/711 |
| 2011/0013365 A1* | 1/2011 | Oota | B62D 5/0406 361/707 |
| 2013/0069221 A1* | 3/2013 | Lee | H01L 23/49811 257/737 |

FOREIGN PATENT DOCUMENTS

| | | |
|---|---|---|
| DE | 102 54 566 | 6/2004 |
| DE | 103 06 312 | 7/2004 |
| DE | 103 29 082 | 10/2004 |
| EP | 1 576 704 | 7/2004 |
| JP | 2008-258489 | 10/2008 |
| TW | 200417103 | 9/2004 |
| WO | 2004/062051 | 7/2004 |

OTHER PUBLICATIONS

Austrian Search Report Conducted in Counterpart Austrian Appln. No. A 50849/2013 (dated Oct. 8, 2014).

* cited by examiner ardescription # CARRIER MODULE WITH BRIDGING ELEMENT FOR A SEMICONDUCTOR ELEMENT The present application claims priority under 35 U.S.C. §119(a) of Austrian Patent Application No. A50849/2013 filed Dec. 20, 2013, the disclosure of which is expressly incorporated by reference herein in its entirety.

The present invention relates to a carrier module for at least one semiconductor element having a passively and/or actively cooled carrier which has a positive carrier contact and a negative carrier contact, with a device for bridging the at least one semiconductor element arranged on the carrier, comprising at least one first printed circuit board with at least one bridging element, wherein at least one positive contact which is electrically conductively connected to the positive carrier contact and at least one negative contact which is electrically conductively connected to the negative carrier contact are provided on a first printed circuit board and the bridging element is electrically conductively connected to the positive contact and to the negative contact of the first printed circuit board.

In the meantime, semiconductor elements, such as laser diodes for example, have many uses both in material processing and in joining technology. Here, for reasons of power scaling or to increase the output power, a plurality of semiconductor elements are usually connected in series to form a complete system. As is generally known, however, series connection has the disadvantage that, if one semiconductor fails, this leads to an interruption of the whole system and the manufacturing process for which, for example, the laser system is being used, is disrupted. If, therefore, a high-resistance fault is present with a semiconductor component, a bridging of the semiconductor element must be provided.

In this regard, EP 1 576 704 B1 shows a bridging element in the form of one or more semiconductor components or relays which are connected in parallel with a laser diode in order to electrically bridge it directly in the event of a failure of the laser diode. The laser diode and the associated bridging element(s) are mounted on a common carrier which is designed as a heat sink. The design is such that the connecting means, for example hard solder, of the bridging element which is mounted first has a higher melting point than the connecting means, for example soft solder, of the subsequently mounted laser diode. This is intended to prevent damage to the connection of the bridging segment to the common heat sink in the course of mounting the laser diode.

A disadvantage is that a possible defect of the bridging element is not taken into account and, in such an event, the whole carrier including laser diode and bridging element must be replaced. Simply removing and/or replacing the bridging element is not possible due to the direct substance-to-substance mounting on the heat sink and the constellation of different connecting means and their different melting points.

DE 103 29 082 A1 shows an electrical series element, for example a diode laser, with which a bridging element is formed in parallel in order to be able to bridge the diode laser in the event of a high-resistance defect. A series of different switching contacts, the initiating mechanism of which can be of a chemical or physical nature, is envisaged for bridging the diode laser. The use of a fusible wire, which is destroyed as the result of severe heating and closes a contact for bridging the diode laser, is cited as an example. The use of a reactive material, which expands accordingly as a result of severe heating and closes a contact, is also considered. The closing of said contacts accordingly bridges a diode laser with a high-resistance defect and prevents an interruption as already described of a possible complete system.

It is considered to be disadvantageous that the irreversible embodiments shown do not enable the bridging to be reset. Initiation of the bridging unit inevitably leads to the necessary replacement of the initiation mechanism. Particularly in the case of a possible spurious initiation, this therefore results in unnecessary maintenance effort. Furthermore, it must be noted that the device does not have appropriate cooling, as the components provided are based on the principle of thermal overload.

The object of the present invention consists in providing a carrier module for a semiconductor element with an easily added and/or replaceable device for bridging the semiconductor element, wherein the device for bridging the semiconductor element is to be adequately cooled.

According to the invention, this object is achieved in that the first printed circuit board is thermally conductively and releasably connected to the carrier. This allows the heat which may be produced by the bridging element which is fixed to the first printed circuit board to be dissipated using the cooling effect of the carrier. As the first printed circuit board is releasably connected to the carrier, this enables the bridging device to be easily replaced or the carrier to be easily added.

An advantageous embodiment of the invention provides that the bridging element is thermally conductively connected to the first printed circuit board. This allows the bridging element to dissipate heat, which is produced as a result of power loss, to the first printed circuit board. This prevents a possible build-up of heat at the bridging element.

Further, it is advantageously provided that the positive contact of the first printed circuit board is connected to the positive carrier contact by means of at least one electrically and thermally conductive first spacer and/or that the negative contact of the first printed circuit board is connected to the negative carrier contact by means of at least one electrically and thermally conductive second spacer. This enables a thermal contact to be also produced by means of an electrical connection, which is in any case necessary, between one of the contacts of the first printed circuit board and at least one of the carrier contacts. Therefore, not only are current and voltage transmitted via the spacer(s), but heat from the bridging element or from the printed circuit board is also dissipated to the cooled carrier. As two tasks in one can be fulfilled by means of the spacers used, this results in a more cost-effective and simpler construction of the carrier module.

In an advantageous manner, it is provided that the first printed circuit board lies within the external contour of the footprint of the carrier. This ensures, for example, that a plurality of carrier modules can be arranged lying alongside one another without the respective first printed circuit boards obstructing one another. Furthermore, as a result, the arrangement of optical elements, which is usually carried out in front of and/or next to the semiconductor element, is not negatively affected by the first printed circuit board. The same applies for any connections or devices which are usually arranged on the rear of the carrier module. This therefore considerably simplifies the retrospective addition or replacement of the device for bridging the semiconductor element.

In an advantageous manner, the bridging element is formed by a field effect transistor. This allows the bridging of the semiconductor element to be realized by an easily switchable component which is available in large quantities and is therefore cost-effective, wherein the bridging of the semiconductor element is also reversible due to the possibility of switching the FET. As simple and cost-saving standard technology is used for the bridging element, the handling of non-encapsulated semiconductor chips, for example, is unnecessary. Mounting is also considerably simplified and therefore cost-reduced, as, for example, no clean room environment is necessary. The replaceability or adaptability to changing conditions with regard to the semiconductor element or the current source used is likewise simplified by the high availability of the bridging element used.

In an advantageous manner, it is provided that the bridging element is designed as an SMD component. This enables a particularly cost-effective and compact design of the device for bridging the at least one semiconductor which is arranged on the carrier. At the same time, retrofitting or replacement of defective bridging elements is also particularly easy and cost-effective thanks to the use of standard technology.

An advantageous embodiment provides that a control unit for the at least one bridging element and a connection between the control unit and the bridging element for transmitting control signals is provided on the first printed circuit board. The control electronics allows an active resetting of the bridge by means of the bridging element. A fault, such as a possible spurious initiation of the bridging of the semiconductor element for example, can therefore be easily rectified or investigated.

An advantageous embodiment provides that the control unit for the at least one bridging element is arranged on a second printed circuit board. As the first printed circuit board is subjected to a higher thermal stress due to heating as a consequence of the power converted at the bridging element, it is advantageous to arrange the control unit separately. As a result, the control unit is not subjected to unnecessary heating which could lead to it becoming damaged.

Advantageously, it is provided that the second printed circuit board is releasably connected to the first printed circuit board by means of at least one secondary spacer. For example, this allows an arrangement of the second printed circuit board above the first printed circuit board at a distance from the bridging element.

A further advantageous embodiment provides that the second printed circuit board lies within the external contour of the footprint of the carrier. The advantages arising from this are similar to those advantages which have already been stated for the first printed circuit board. In the same way as with the first printed circuit board, this ensures that, for example, a plurality of carrier modules can be arranged lying alongside one another without the respective printed circuit boards obstructing one another.

Figure 2:
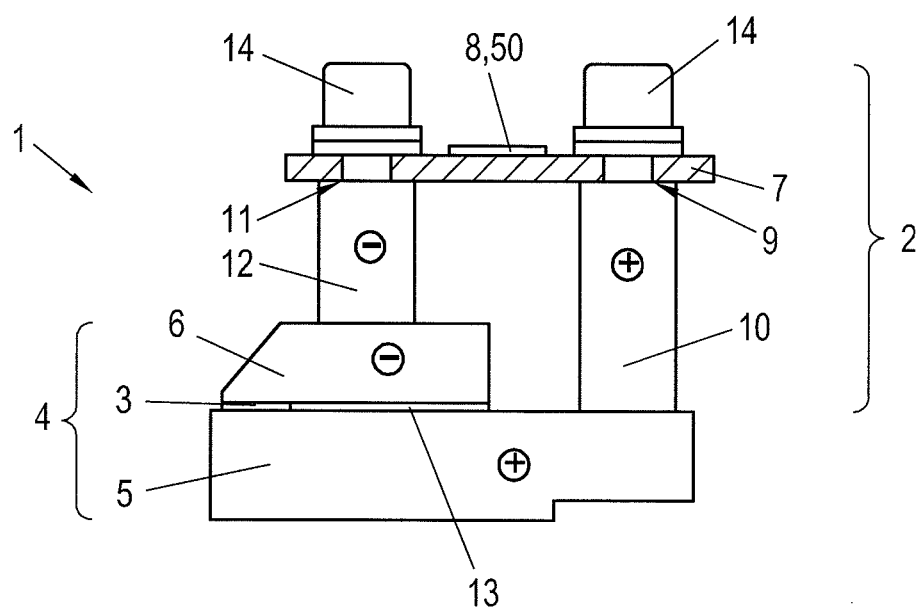
Figure 3:
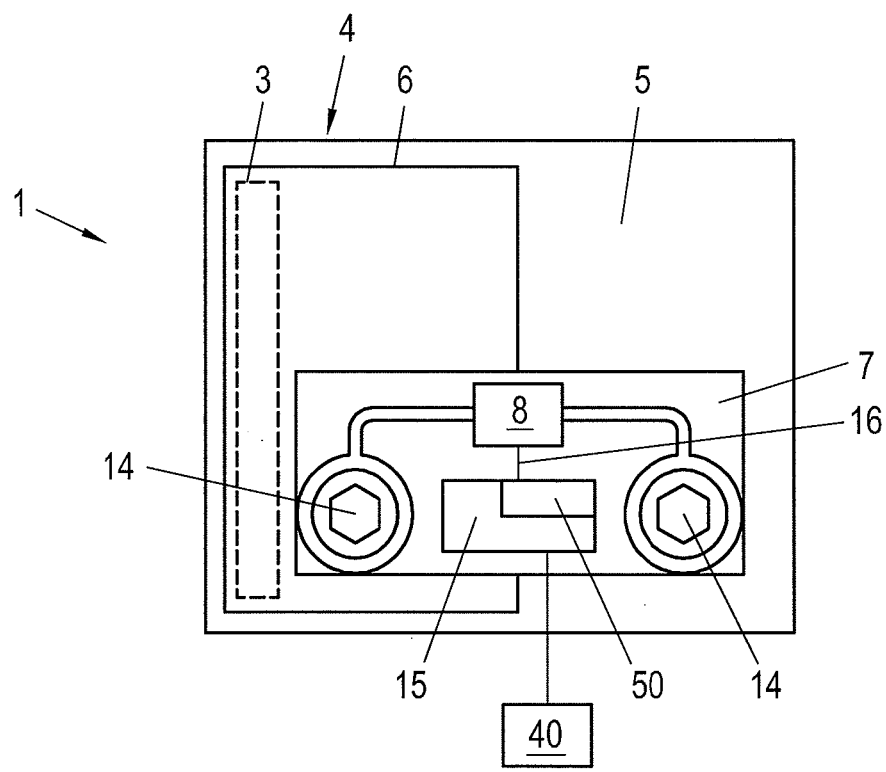
Figure 4:
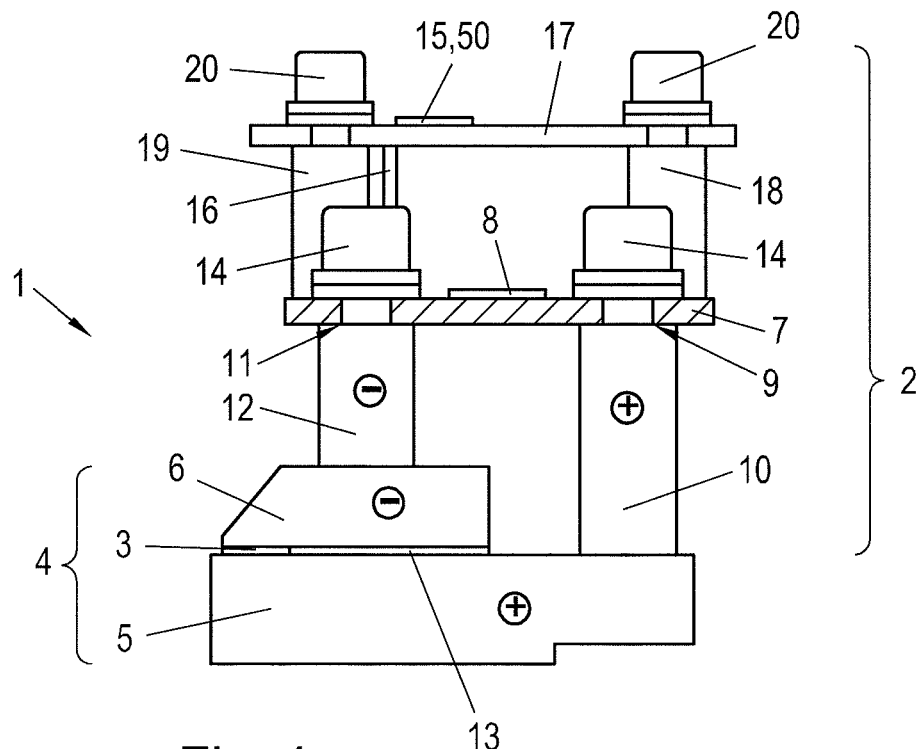

The present invention is described in more detail below with reference to FIGS. 1 to 6 which show advantageous embodiments of the invention by way of example, schematically and without restriction. In the drawings FIG. 1 shows a carrier module including the device for the reversible bridging of a semiconductor element, FIG. 2 shows an embodiment of the carrier module including the device for the reversible bridging of a semiconductor element, FIG. 3 shows a plan view of the device shown in FIG. 2, FIG. 4 shows an advantageous embodiment of the device shown in FIGS. 1 to 3, FIG. 5 shows a further variant of the device shown in FIG. 4, FIG. 6 shows the electrical series circuit of a plurality of carrier modules according to the invention.

As already mentioned in the introduction, in laser machining, for example, a plurality of semiconductor elements are connected in series to form a complete system in order to increase the output power. As has also already been stated, this has the disadvantage that, in the event of failure of a semiconductor element, the whole system is interrupted and the manufacturing process is disrupted. If, therefore, a high-resistance fault is present with a semiconductor component, a bridging of the semiconductor element must be provided in order to avoid the described disruption.

The carrier module 1 according to the invention for at least one semiconductor element 3 is shown in FIG. 1. An appropriate voltage is applied to the semiconductor element 3, for example a diode laser or an appropriate diode laser stack, via the carrier 4. The carrier 4 has a positive carrier contact 5 and a negative carrier contact 6, to which the semiconductor element 3 is conductively connected. By way of example, the carrier 4 is shown in FIG. 1 in a single-part design, with which the positive carrier contact 5 and the negative carrier contact 6 are shown by means of contact tracks which are electrically separate from one another. The carrier 4 can, of course, also be designed with multiple parts, such as is shown in FIG. 2 for example, wherein different parts can be designed as different carrier contacts.

During operation, as already mentioned, an appropriate voltage is applied to the semiconductor component 3, as a result of which its laser radiation, for example, is emitted by the semiconductor component. As, in doing so, the semiconductor component 3 heats up accordingly, the carrier 4 is designed as a heat sink. For this purpose, the carrier 4 can be actively and/or passively cooled. Active cooling can be realized, for example by arranging appropriate cooling channels in the carrier 4 through which a suitable cooling medium flows. An appropriate choice of material for the carrier 4 can contribute to passive cooling, for example, by means of which the heat can be dissipated from the semiconductor element 3 correspondingly well. At the same time, other materials can also be incorporated locally into the carrier 4 in order to improve its heat spread or heat dissipation, as described, for example, in DE10 113 943 B4.

Further, a device 2 for bridging the semiconductor component 3 which is arranged on the carrier 4 is shown in FIG. 1. This consists of a first printed circuit board 7 with at least one bridging element 8. The at least one bridging element 8 can, for example, be in the form of a field effect transistor, hereinafter referred to as FET.

The first printed circuit board 7 has at least one positive contact 9 which, for example, is electrically conductively connected to the positive carrier contact 5 by means of the connection 22. Further, the first printed circuit board 7 has at least one negative contact 11 which, for example, is electrically conductively connected to the negative carrier contact 6 by means of the connection 23. The bridging element 8 is in turn electrically conductively connected to the positive contact 9 and to the negative contact 11 of the first printed circuit board 7 and therefore also to the semiconductor element 3. The connections 22 and 23 can, of course, be realized by any form of electrically conductive connections.

If a high-resistance defect is present at the semiconductor element 3, no current or only a very small current flows through it. In consequence of this, the bridging element 8 can be switched to a conducting state by means of an appropriate initiating circuit 50. For this purpose, the voltage of the semiconductor element 3 is tapped off by the initiating circuit 50 by means of the connections 22 and 23 and is compared to a desired value by means of a circuit which compares voltages with one another, for example a comparator circuit. The said desired value can be fixed, for example, or be provided by a suitable controller. If this is exceeded, that is to say a defect is present at the semiconductor element 3, the FETs are activated so that the current flows via the bridging element 8, as a result of which the semiconductor element 3 is bridged.

If the defective semiconductor element 3, usually including the carrier 4, is replaced by a functioning element, an appropriate current can again flow via the semiconductor component 3, as a result of which the initiating circuit 50 switches the bridging element 8 back to a non-conducting state. As a result, the semiconductor component 3 is again operated correctly and is no longer bridged. For this reason, the bridging process is reversible without having to replace components of the device 2.

Instead of an FET, the bridging element 8 can, of course, also consist of a plurality and/or of other suitable types of components, such as for example thyristors or similar. In order to achieve a particularly space-saving design, the bridging element 8 can be realized in SMD (Surface Mounted Device) form.

The bridging element 8 is connected, for example by means of a solder connection, to the positive contact 9 and to the negative contact 11 of the first printed circuit board 7. So-called "thermal vias", which conduct the heat resulting from the power loss of the bridging element 8 to all strata, or layers, of the first printed circuit board 7 and in particular to the side thereof facing the carrier 4, are located in the first printed circuit board 7. This results in an improved thermal connection of the bridging element 8 to the first printed circuit board 7.

As shown by way of example in FIG. 1, the first printed circuit board 7 is connected to the carrier 4 in such a way that the printed circuit board 7 is in direct contact with the carrier 4. As an example, fixing is by means of at least one screw 14. In this way, the first printed circuit board 7 is thermally conductively and releasably connected to the carrier. The releasable connection by means of at least one screw 14 is only cited here as an example. Other releasable connections, such as plug-in or clamp connections, are also conceivable.

In FIG. 2, by way of example, the carrier 4 is formed by a top and bottom part, which constitute the electrically positive carrier contact 5 and the electrically negative carrier contact 6. The fact that, as shown, the whole top part of the carrier 4 forms the positive carrier contact 5 or the electrically positive pole, and the whole bottom part of the carrier forms the negative carrier contact 6 or the electrically negative pole, is only an example. A reciprocal design is likewise totally conceivable.

If, as shown in FIG. 2, the carrier 4 is designed in two parts, the positive carrier contact 5 and the negative carrier contact 6 are electrically insulated from one another by means of an insulator 13 in that region which does not serve to carry current to the semiconductor component 3. The design shown in FIG. 2 is already advantageously formed to that effect in that the positive contact 9 of the first printed circuit board 7 is connected to the positive carrier contact 5 by means of a first spacer 10. This spacer 10 corresponds to the connection 22 and in doing so is designed to be both electrically and thermally conductive. The same applies for the second spacer 12 shown, which connects the negative contact 11 of the first printed circuit board 7 to the negative carrier contact 6 in a corresponding way to the connection 23. In this way, the bridging element 8, which is connected to the first printed circuit board 7, is both electrically and thermally conductively connected to the carrier 4, or to the positive carrier contact 5 and to the negative carrier contact 6, by means of the positive contact 9 and the negative contact 11 of the first printed circuit board 7.

The electrical connection of the first printed circuit board 7 to the carrier 4 can, of course, also be made in different ways, for example by means of appropriate wires, clips or similar which are rigid or flexible in design.

As shown by way of example in FIG. 2, the connection can be made by means of continuous screws 14 which are screwed into the carrier 4 and in doing so connect the first printed circuit board 7 and the corresponding spacers 10 and 12 to the carrier 4 in a clamping manner. As a result, the first printed circuit board 7 is thermally conductively and releasably connected to the carrier 4. Instead of the screw connection cited by way of example, any other suitable form of connection, for example plug-in connections or similar, can of course be used.

FIG. 3 shows a plan view of the carrier module 1 shown in FIG. 2. As can be seen, the dimensions of the first printed circuit board 7 are designed such that it lies within the external contour of the footprint of the carrier 4. As a result, a plurality of carrier modules 1 can be arranged next to one another if necessary, without the individual first printed circuit boards 7 overlapping one another.

A control unit 15 for the bridging element 8 and a connection 16 between the control unit 15 and the bridging element 8 for transmitting control signals can also be seen in FIG. 3 on the first printed circuit board 7.

The control unit 15 is designed so as to enable the bridging element 8 to be reset, for example, in accordance with the initiating circuit 50. Here, reset is understood to mean the resetting of the bridging element 8 to a non-conducting state. A fault, such as a possible spurious initiation of the bridging of the semiconductor element 3 for example, can therefore easily be rectified or the justified initiation investigated.

A possible spurious initiation of the bridging element 8 can, for example, result from variations in the energy supply.

Further, the control unit 15 enables individual semiconductor elements 3 to be switched on or off, for example to influence the power or beam formation. Directly placing the control unit 15 on the first printed circuit board 7 saves additional space, for example, for connecting wires.

The control unit 15 can therefore also contain the already mentioned initiation circuit 50 for activating the bridging element 8 in the event of a high-resistance defect, as is shown by way of example in FIGS. 3 to 6. The bridging element is activated by the control unit 15 depending on the current state of the semiconductor element 3. For this purpose, the control unit 15 can, for example, determine the current flow via the semiconductor component 3, or receive it from a superimposed control unit 40. Monitoring by the control unit 15 of the power emitted by the semiconductor element 3 would also be conceivable for example. With appropriate changes, the bridging element 8 is switched to a conducting/bridging state by the control unit 15. This process is, of course, likewise reversible.

Further, the control unit 15 can be designed such that characteristic data, such as current, temperature and emitted power of the semiconductor element 3, are gathered and forwarded for further processing, for example to the above-mentioned superimposed control unit 40.

FIG. 4 shows an advantageous embodiment, in which the control unit 15 for the at least one bridging element 8 is arranged on a second printed circuit board 17. This results in a modular design, as the bridging element 8 is realized separately from the control unit 15. In the event of damage to the bridging element 8 or to the control unit 15, the components can therefore be replaced separately from one another and correspondingly cost effectively.

Further, it must be noted that the first printed circuit board 7 is subjected to a higher thermal stress due to the heating of the bridging element 8. For this reason too, it is advantageous to arrange the control unit 15 separately. As a result, the control unit 15 is not subjected to unnecessary heating which could lead to it becoming damaged.

The second printed circuit board 17 is releasably connected to the first printed circuit board 7 by means of at least one secondary spacer 18. In the exemplary embodiment shown in FIG. 4, the printed circuit board is releasably connected to the first printed circuit board 7 by means of two secondary spacers 18 and 19, wherein the use of two secondary spacers 18 and 19 is chosen purely by way of example. Using at least one secondary spacer 18 enables the second printed circuit board 17 to be arranged at an appropriate distance above the first printed circuit board 7. This in turn enables an extremely space-saving design with regard to the base surface or footprint.

In a quite similar way to the releasable connection between the carrier 4 and the first printed circuit board 7, the connection between first printed circuit board 7 and second printed circuit board 17 can also be made by means of screws 20. Again, instead of the screw connection cited by way of example, any other suitable form of connection, for example plug-in connections or similar, can of course also be used. It would also be possible to choose the screws 14 already used for the first printed circuit board 7 with an appropriate length and to fix the second printed circuit board 17, the secondary spacers 18 and 19, the first printed circuit board 7 and the first spacers 10 and 12 together to the carrier.

As already stated for the first printed circuit board 7, it is provided that the second printed circuit board 17 also lies within the external contour of the footprint of the carrier 4. In the same way as with the first printed circuit board 7, this ensures that, for example, a plurality of carrier modules 1 can be arranged lying next to one another, without the respective printed circuit boards 7 or 17 overlapping one another.

Figure 5:
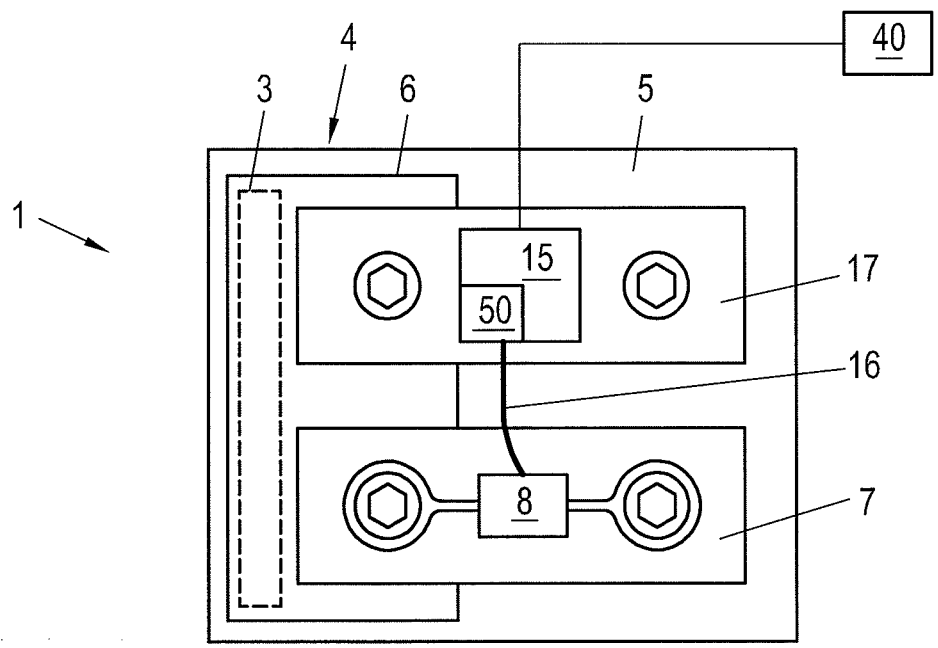
Figure 6:
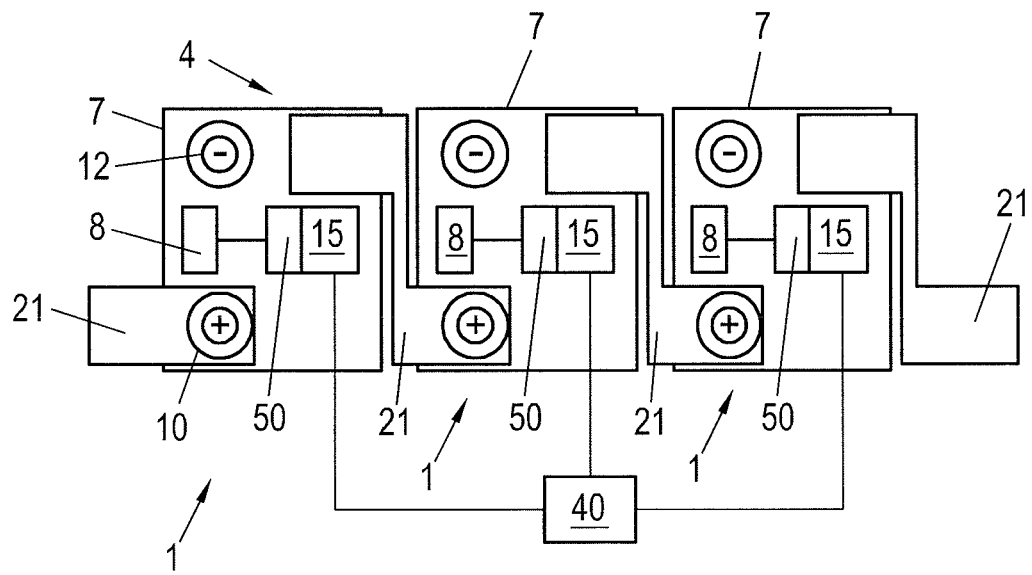

As shown by way of example in FIG. 5, an arrangement of the second printed circuit board 17 next to the first printed circuit board 7 is of course also possible.

As already stated for FIG. 3, the connection of the control unit 15 to the bridging element 8 is made by means of the connection 16. In the embodiments shown in FIG. 4 and FIG. 5, this is realized in the form of a connecting wire or similar. For example, the connection 16 can also be realized in the form of a plug-in connection between the bridging element 8 and the control unit 15. Advantageously, for this purpose, the distance between first printed circuit board 7 and second printed circuit board 17 is adapted accordingly to suit the plug-in connection.

As already stated, for reasons of power scaling, a plurality of semiconductor components 3 are connected electrically in series. FIG. 6 shows an appropriate design.

For example, appropriate electrical connecting elements 21 are used to produce an electrically conductive connection between individual carrier modules 1 and, in this way, to electrically connect the semiconductor elements 3 arranged thereon in series. Here, the electrical connecting elements 21 can be formed, for example, by appropriate metal busbars, although any other form of electrically conductive connection, such as for example flexible cable connections or similar, is also conceivable.

As shown in FIG. 6, the electrical connecting elements 21 connect the negative carrier contact 6 of a carrier module 1, for example, to the positive carrier contact 5 of further carrier module 1. In this way, any number of carrier modules 1 can be connected in series, as a result of which appropriate output powers can be realized.

In the event of a high-resistance defect of one of the semiconductor elements 3, because of the device 2 for bridging the corresponding carrier module 1, it is ensured that there is no failure of the whole system and that there is no interruption of the whole series circuit of the carrier module 1. This effectively prevents a failure or interruption of a possible manufacturing process.

The invention claimed is:

1. A carrier module for at least one semiconductor element, comprising:
   at least one of a passively and/or actively cooled carrier, on which the at least one semiconductor element is positionable, having a positive carrier contact and a negative carrier contact;
   a bridging device, which is structured to bridge the at least one semiconductor element when positioned on the carrier, comprising at least one first printed circuit board with at least one bridging element and at least one initiation unit,
   wherein the at least one first printed circuit board comprises at least one positive contact, which is electrically conductively connected to the positive carrier contact and at least one negative contact, which is electrically conductively connected to the negative carrier contact,
   wherein the at least one bridging element is electrically conductively connected to the positive contact and to the negative contact of the at least one first printed circuit board,
   wherein the at least one first printed circuit board is thermally conductively and releasably connected to the carrier, and
   wherein, in an event of a high resistance defect at the semiconductor element, the initiation unit is connected to activate the bridging element so current bypasses the semiconductor element via the bridging element.

2. The carrier module as claimed in claim 1, wherein the bridging element is thermally conductively connectable to the at least one first printed circuit board.

3. The carrier module as claimed in claim 1, wherein the positive contact of the first printed circuit board is connected to the positive carrier contact by means of at least one electrically and thermally conductive first spacer and/or that the negative contact of the first printed circuit board is connected to the negative carrier contact by means of at least one electrically and thermally conductive second spacer.

4. The carrier module (1) as claimed in claim 1, wherein the at least one first printed circuit board lies within the external contour of the footprint of the carrier.

5. The carrier module as claimed in claim 1, wherein the at least one bridging element is formed by a field effect transistor.

6. The carrier module as claimed in claim 1, wherein the at least one bridging element is designed as an SMD component.

7. The carrier module as claimed in claim 1, further comprising a control unit for the at least one bridging element and a connection between the control unit and the at least one bridging element for transmitting control signals is provided on the at least one first printed circuit board.

8. The carrier module as claimed in claim 7, wherein the control unit for the at least one bridging element is arranged on a second printed circuit board.

9. The carrier module as claimed in claim 8, wherein the second printed circuit board is releasably connected to the at least one first printed circuit board via at least one secondary spacer.

10. The carrier module as claimed in claim 8, wherein the second printed circuit board lies within an external contour of a footprint of the carrier.

11. A device further comprising: at least a second carrier module; and the at least two carrier modules in accordance with claim 1; at least a second semiconductor element, each of the at least two semiconductor elements being positioned on respective ones of the at least two carrier modules: and connecting elements being arranged to electrically connect the at least two semiconductor elements in series.

* * * * *